United States Patent [19]

Murphy

[11] Patent Number: 5,366,332
[45] Date of Patent: Nov. 22, 1994

[54] COMPLIANT FASTENER

[75] Inventor: Morgan D. Murphy, Kokomo, Ind.

[73] Assignee: Delco Electronics Corp.

[21] Appl. No.: 110,259

[22] Filed: Aug. 23, 1993

[51] Int. Cl.$^5$ .................... F16B 19/00; F16B 21/00
[52] U.S. Cl. ................... 411/509; 411/342; 411/908; 411/913
[58] Field of Search ............... 411/341, 342, 508, 509, 411/510, 37, 907, 908, 913

[56] References Cited

U.S. PATENT DOCUMENTS

| | | | |
|---|---|---|---|
| 2,327,328 | 8/1943 | Murphy | 24/73 |
| 2,657,948 | 11/1953 | Sturtevant | 411/509 |
| 2,791,366 | 5/1957 | Geisler | 411/907 X |
| 3,029,486 | 4/1962 | Raymond | 411/509 |
| 3,905,270 | 9/1975 | Hehl | 411/509 |
| 4,122,583 | 10/1978 | Grittner et al. | 24/208 A |
| 4,197,781 | 4/1980 | Giannuzzi | 411/341 |
| 5,288,189 | 2/1994 | Hepworth | 411/37 X |

OTHER PUBLICATIONS

Catalog 22, Micro Plastics, Inc., pp. 18-26 (no date indicated).

Primary Examiner—Neill R. Wilson
Attorney, Agent, or Firm—Jimmy L. Funke

[57] ABSTRACT

A fastener is provided which is particularly suited for joining two or more panel members together, such as a circuit board with the internal support chassis of an electrical enclosure or casing. The fastener is configured with a compliant lower portion, such that the fastener can be installed and secured with a simple push-through action which requires only a moderate force. Because assembly of the fastener does not require a rotational motion, assembly costs for automated assembly operations are reduced, while physical demands on an assembler are significantly reduced for manual assembly operations. The fastener is reusable, in that the fastener can be readily removed without being plastically deformed.

19 Claims, 2 Drawing Sheets

COMPLIANT FASTENER

The present invention generally relates to fasteners for securing two or more panel-like members together. More particularly, this invention relates to a lightweight and reusable fastener which can be readily installed to secure a circuit board to the support chassis of an enclosure or casing, wherein assembly of the fastener with the circuit board and support chassis involves a simple push-through action which automatically deploys a retaining feature that clamps the circuit board to the support chassis.

BACKGROUND OF THE INVENTION

Numerous varieties of fasteners have been developed in response to the diversity of applications for which fasteners can be used. As manufacturing processes become more automated, there has been an increased emphasis on developing fasteners which simplify and facilitate assembly, yet which are capable of reliably securing the particular members being joined. Such a need exists in the electronic industry for the purpose of reliably securing circuit boards to the support frame or chassis of electronic enclosures, cabinets and casings. Fasteners for this type of application generally must be capable of being installed without damage to the circuit board and chassis, yet must also provide secure and reliable attachment so as ensure sufficient vibration resistance.

Generally, the particular type of fastener suitable for a given task is heavily dependent upon the characteristics of the structures being joined, such as their relative thicknesses and materials, the method of installation, and whether the joint is intended to be permanent or temporary. Conventionally, threaded fasteners are widely used to secure circuit boards to a chassis, at times incorporating a self-locking feature to discourage the fastener from becoming loose due to vibration. However, a significant disadvantage associated with the use of threaded fasteners is that they require a rotational motion for installation. In terms of automated assembly methods, those that require a rotational motion add significant costs to the assembly process. When manual assembly methods are used, threaded fasteners are often undesirable in that carpal tunnel syndrome has been linked to the ratcheting motion required to install such fasteners. In addition, it is desirable to avoid the relatively greater weight and costs associated with threaded fasteners.

For joining thin panel-like members such as a circuit board and chassis, various approaches have been suggested which often employ some type of expandable feature. Such features have long been used to secure two panels together, as illustrated by the snap fastener of U.S. Pat. No. 2,327,328 to Murphy. However, fasteners of this type are not suitable for securing a circuit board to a chassis, in that the snap fastener can be easily disengaged, and the clamping force generated by the snap ring is generally uncontrollable and often insufficient to resistant vibration.

U.S. Pat. No. 4,122,583 to Grittner et al. teaches a mechanically expandable fastening clip which is intended for securing an interior trim panel to the body panel of a vehicle. However, the fastening clip taught by Grittner et al. is not generally suitable for securing a circuit board to a chassis, in that after assembly, the circuit board and chassis are spaced apart instead of being held in intimate contact, making the circuit board more susceptible to vibration. Furthermore, the fastening clip is rather complicated in its construction, and must be pre-assembled to the circuit board. Furthermore, the clip is not readily reusable, in that the expandable portion of the clip is likely to be plastically deformed during removal of the fastener.

Numerous forms of fasteners incorporating an expandable feature have been specifically suggested for use in the electronics industry to secure a circuit board to a chassis. Generally, however, such prior art fasteners have several disadvantages, including the inability to be removed without access to both sides of the circuit board, clamping loads which are not readily controllable, excessive weight or size, and excessive forces required for installation.

Thus, it would be desirable to provide a relatively low cost, reusable fastener for joining together two or more relatively thin members, such as a circuit board and a support chassis, wherein the fastener can be easily installed manually or with the use of automated equipment without involving a rotational motion. Further, the fastener should be capable of maintaining intimate contact between the members, and readily removable to allow separation of the members. In addition, the fastener should be capable of generating a predeterminable clamping load, while also being relatively light weight and inexpensive.

SUMMARY OF THE INVENTION

It is an object of this invention to provide a fastener which is particularly adapted to permanently join two or more panel-like members, such as a circuit board with a support chassis.

It is another object of this invention that such a fastener be capable of generating a determinable clamping load.

It is a further object of this invention that such a fastener be readily installable through the application of a moderate longitudinal force on the fastener.

It is a yet another object of this invention that the application of such a longitudinal force simultaneously implement an expandable feature on the fastener, which serves to engage and secure the panels together.

It is a yet a further object of this invention that such a fastener be relatively light weight and low cost.

Lastly, it is still a further object of this invention that such a fastener be readily removable so as to permit separation of the panels and subsequent reuse of the fastener.

In accordance with a preferred embodiment of this invention, these and other objects and advantages are accomplished as follows.

According to the present invention, there is provided a permanent fastener suitable for joining two or more panels using automated or manual assembly techniques. The fastener is designed to be assembled in preformed holes in the panels, and is particularly adapted for securing a circuit board to the support chassis of an enclosure or casing, wherein access to both sides of the circuit board is impracticable. Furthermore, the fastener is relatively light weight, can be readily removed in order to permit removal of the circuit board, and can be subsequently reused. The fastener of this invention simplifies the assembly procedure for mounting a circuit board within an enclosure or casing, in that only a moderate longitudinal force is necessary to install the fastener and deploy a retention feature. Accordingly, the fastener is conducive to both automated and manual assembly methods, in that a rotational motion is not required during assembly.

The fastener includes an upper portion, such as a head, from which a lower compliant portion extends. The lower portion is composed of a number of interconnected members, each of which is flexibly attached to the upper portion to permit their articulation relative to the upper portion. When articulated, the individual members act in unison, so as to cause the lower portion to radially contract when longitudinally extended. Preferably, the individual members are resiliently biased, such that the lower portion normally has a radially expanded shape.

Formed on the lower portion are one or more engagement features which, in cooperation with the upper portion of the fastener, serve to generate a predetermined clamping load between the circuit board and support chassis. A biasing feature is provided in conjunction with the upper portion for enhancing the clamping load imposed by the upper portion and the engagement features.

Installation of the fastener requires a longitudinally reciprocable member, such as a pushrod. The pushrod is engagable with the lower portion, such that application of a moderate longitudinal force on the pushrod is sufficient to radially contract the lower portion to the extent necessary to allow the lower portion to readily pass through the assembly holes formed in the circuit board and support chassis. Once the pushrod is released, the lower portion resiliently resumes its original shape, so as to engage the lower surface of the support chassis and, in conjunction with the biasing feature, clamp the circuit board to the support chassis.

While articulation of the lower portion during installation is achieved with the pushrod, access is provided through the upper portion to allow the lower portion to be mechanically collapsed with a pair of pliers or the like, so as to permit removal of the fastener and thereby release the circuit board from the support chassis.

In accordance with the above, assembly of the circuit board with the support chassis is achieved using an uncomplicated longitudinal motion, such that the assembly process does not involve a rotational motion. Accordingly, the technique by which the fastener of this invention is installed is highly suitable for both automated and manual assembly methods. During assembly, only a moderate force is required to radially contract the fastener's compliant lower portion, permitting the fastener to be easily inserted into the mating holes in the circuit board and support chassis. The compliant nature of the lower portion causes the lower portion to resiliently re-expand once the pushrod is released, such that the circuit board is clamped to the support chassis.

According to a preferred aspect of this invention, the fastener is formed from a sufficiently rigid but light weight plastic, such that the lower portion of the fastener will substantially resume its pre-installation shape after assembly, so as to impose a determinable clamping load between the circuit board and the support chassis. In addition, the fastener can be readily removed by radially collapsing the lower portion via access through the upper portion. Because the fastener is not destroyed during removal, the fastener can be reused several times.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings wherein.

DETAILED DESCRIPTION OF THE INVENTION

A fastener is provided which is particularly suited for joining two or more panel members together, such as a circuit board with the internal support chassis of an enclosure or casing. The fastener is configured to facilitate both automated or manual assembly techniques, in that the fastener can be installed and secured with a simple push-through action which requires only a moderate force. Because assembly of the fastener does not require a rotational motion, assembly costs for automated assembly operations are reduced, while physical demands on an assembler are significantly reduced for manual assembly operations. Furthermore, the fastener is reusable, relatively light weight and inexpensive, and can be readily removed in order to permit removal of the circuit board.

While the fastener of this invention will be described in terms of securing a circuit board to a support chassis, those skilled in the art will recognize that numerous applications exist for this fastener, such that the teachings of this invention are not to be construed as being limited to the specific embodiment and application described below.

Figure 1:
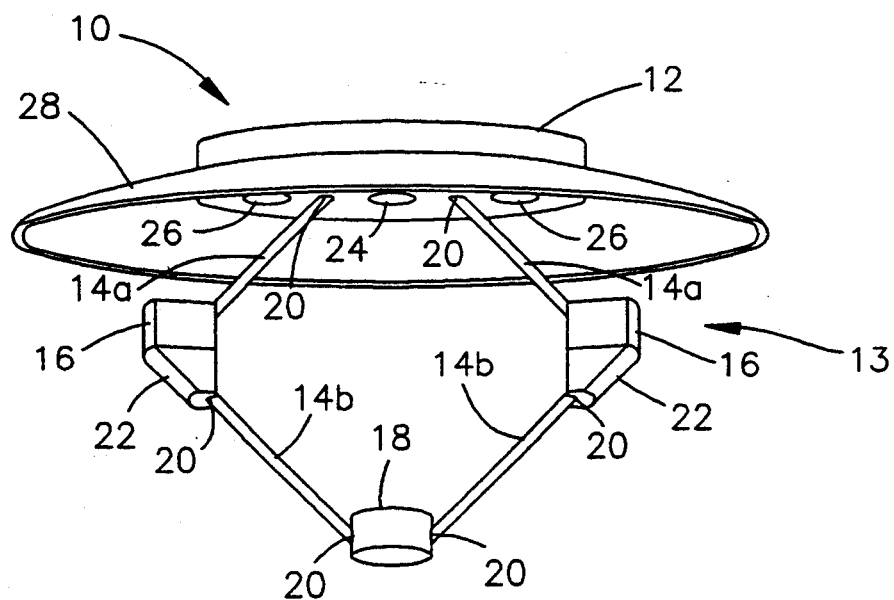
FIG. 1 is a perspective view of a fastener in accordance with a first embodiment of this invention.

With reference to FIG. 1, a fastener 10 in accordance with a first embodiment of this invention includes a head 12 to which a compliant lower portion 13 is attached. The head 12 has a generally planar shape so as to possess a minimal profile above the surface of the circuit board, as well as to more uniformly seat against the upper surface of a circuit board. The head 12 has a guide aperture 24 located centrally in the head 12, so as to permit access to the interior of the lower portion 13 of the fastener 10 through the head 12. In addition, the head 12 preferably includes a pair of access apertures 26 which permit access to the exterior of the lower portion 13 of the fastener 10 through the head 12.

The compliant nature of the lower portion 13 enables the fastener 10 to be installed through aligned holes in the circuit board and support chassis with only a moderate force. In view of the desired compliant nature of the lower portion 13 and the moderate installation force which must be withstood by the fastener 10, the fastener 10 is preferably formed from a suitable structural thermoplastic, such as polypropylene or nylon, as well as others. Plastic fasteners are particularly suitable for mounting circuit boards in that such fasteners do not pose the potential for causing a short in the circuitry on the board. The preferred plastic for a particular application may depend upon the size and type of the panels being joined, with stronger materials being necessary for heavier panels while weaker materials will be suitable for joining lighter panels. For the preferred application in which a circuit board is to be secured to a support chassis, polypropylene and nylon have been found to be suitable materials for the fastener 10 under most conditions.

The compliant lower portion 13 is preferably composed of two articulating segments, each of which consists of an upper member 14a, a retention member 16 and a lower member 14b. Both of the lower members 14b are attached to an assembly thrust member 18. Each upper member 14a is pivotably attached to the head 12 of the fastener 10 and a corresponding one of the retention members 16. Similarly, each lower member 14b is pivotably attached to a corresponding one of the retention members 16 and the assembly thrust member 18.

Articulation is enabled by a flex joint 20 formed between each pair of contiguous members. Generally, the flex joints 20 may be formed as a reduced section at each end of each of the upper and lower members 14a and 14b, though it is foreseeable that other configurations or features could be developed by those skilled in the art to permit articulation of the lower portion 13 of the fastener 10. For example, articulation of the lower portion 13 could be sufficiently achieved by relying solely on the elastic properties of the upper and lower members 14a and 14b. Flexing of the lower portion 13 would occur substantially along the entire length of both the upper and lower members 14a and 14b, instead of flexing occurring only locally at the flex joints 20. Such an embodiment may be advantageous in that molding of the fastener 10 would be facilitated if well defined flex joints 20 were not used.

As shown, the lower portion 13 roughly has a diamond-shaped profile, in that the retention members 16 project radially outward relative to the longitudinal axis of the fastener 10, and the assembly thrust member 18 projects longitudinally away from the head 12. As will be described in fuller detail, this configuration provides the desired clamping action required of the fastener 10. In order to resiliently bias the retention members 16 as shown, the orientation of the upper and lower members 14a and 14b relative to the head 12, retention members 16 and assembly thrust member 18 should be molded-in, such that the elastic memory of the plastic material from which the fastener 10 is formed will urge the lower portion 13 to resume its molded-in configuration after being flexed or otherwise altered.

As shown, the fastener 10 further includes a cantilevered biasing member 28 which extends radially from the head 12 of the fastener 10. The biasing member 28 may be a single annular-shaped member whose outer perimeter is slightly curved toward the lower portion 13 of the fastener 10, as illustrated, or may be composed of a number of individual leaf spring members, each of which has an arcuate form such that their distal ends project toward the lower portion 13. The function of the biasing member 28 is to cooperate with the retention members 16 so as to impose a clamping load on the circuit board and support chassis, as will be discussed more fully below.

Figure 2:
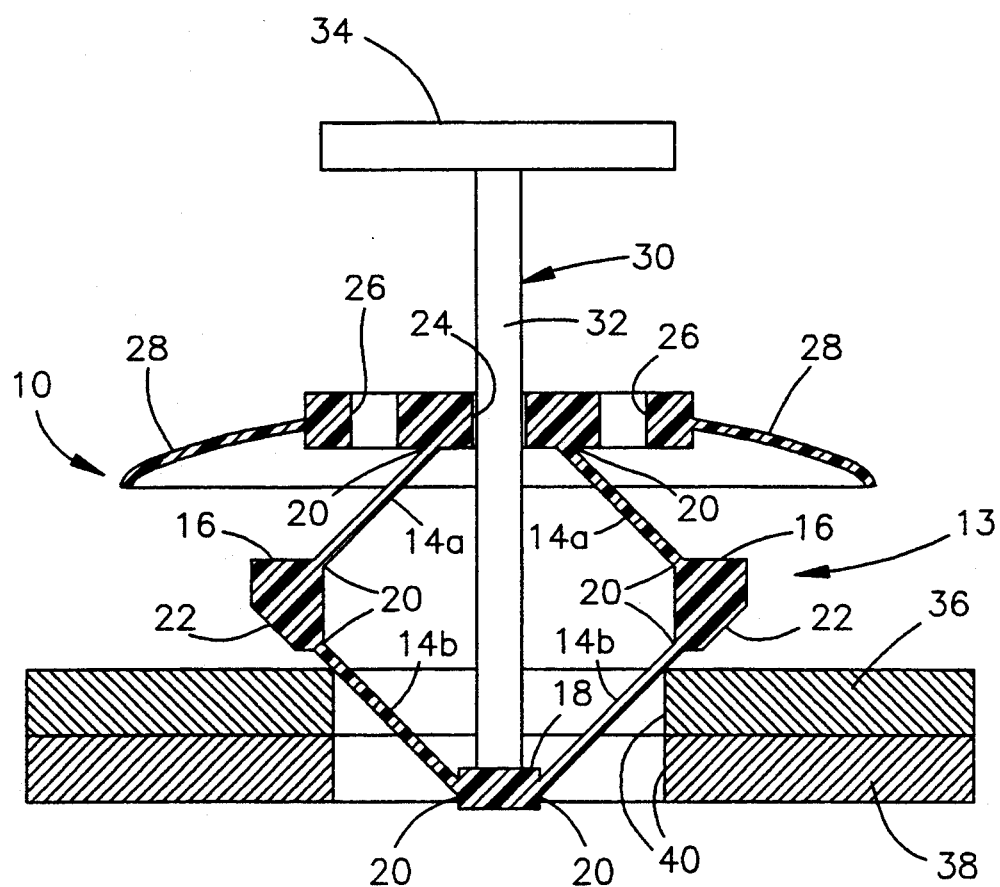
FIGS. 2 through 4 are cross-sectional side views of the assembly procedure for the fastener of FIG. 1, in accordance with this invention.
Figure 3:
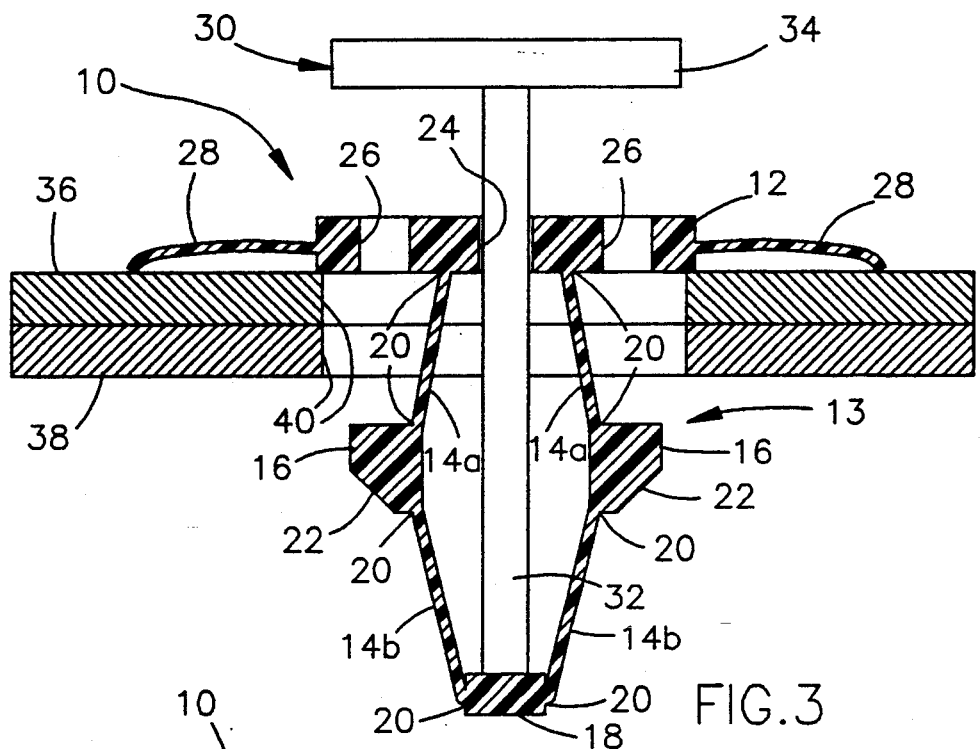

As seen in FIGS. 2 and 3, the fastener 10 is preferably assembled with a pushrod 30 having an elongate shank 32 and a head portion 34. In use, the shank 32 of the pushrod 30 is disposed through the guide aperture 24 in the head 12 and abuts the assembly thrust member 18. The pushrod 30 may be formed as an integral part of the fastener 10, or provided as a separate component. If provided separately, such that the pushrod 30 is repeatedly used to install a number of fasteners 10, the pushrod 30 should be formed from a suitably strong material, such as a structural plastic or metal. Otherwise, the pushrod 30 may be integrally molded with the fastener 10, such as by being connected to the fastener 10 with a frangible member (not shown) which temporarily secures the pushrod 30 to the fastener 10. The frangible member would secure the pushrod 30 to the head 12, and be readily fractured upon application of a moderate force, such as the force intended to articulate the lower portion 13 of the fastener 10. Because the force required to assemble the fastener 10 is relatively low, the pushrod 30 need only be constructed to withstand a moderate impact imposed by any suitable impact device, such as a hand-held tool or an automated installation gun.

Figure 4:
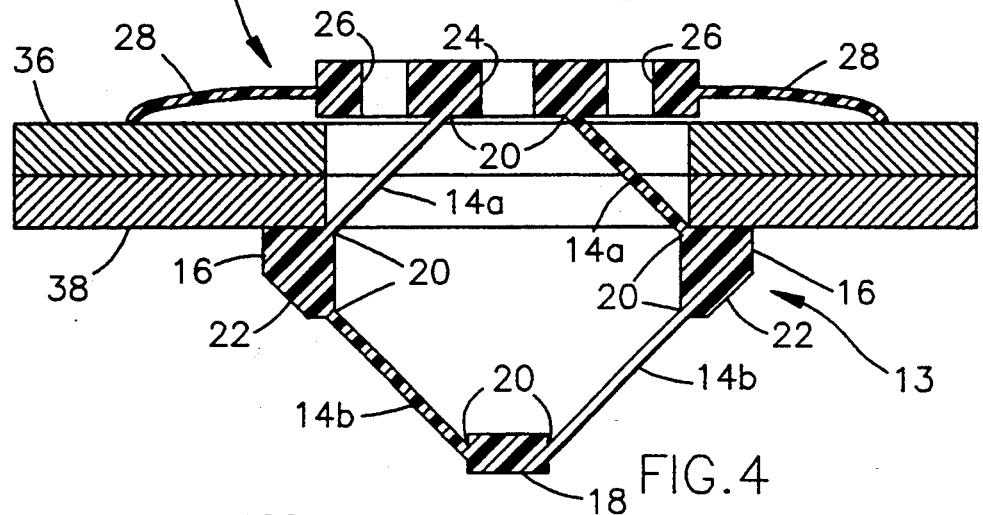

The remaining features of the fastener 10 will be further explained in conjunction with the installation procedure of the fastener 10, as illustrated in FIGS. 2 through 4.

FIG. 2 illustrates the relative positions of each of the members of the fastener 10 prior to assembly of the fastener 10 into a pair of through-holes 40 formed in a circuit board 36 and its support chassis 38. As illustrated, the lower portion 13 of the fastener 10 is generally diamond-shaped, such that the retention members 16 project radially outward relative to the longitudinal axis of the fastener 10. As such, the fastener 10 cannot be reliably inserted through the holes 40 by applying a force to the head 12 of the fastener 10, in that the lower portion 13 may potentially buckle longitudinally.

Installation of the fastener 10 through the holes 40 is achieved by applying a moderate longitudinal force to the head portion 34 of the pushrod 30. In doing so, the shank 32 of the pushrod 30 will force the assembly thrust member 18 downward, such that the lower portion 13 is radially contracted, as shown in FIG. 3.

FIG. 3 illustrates the configuration of the fastener 10 immediately after being forcibly inserted through the holes 40 in the circuit board 36 and support chassis 38. As indicated, application of the moderate force against the pushrod 30 longitudinally extends the assembly thrust member 18, which simultaneously causes the retention members 16 to be drawn radially inward relative to the longitudinal axis of the fastener 10. Consequently, the effective diameter of the lower portion 13 of the fastener 10 is reduced sufficiently to allow the retention members 16 to pass through the holes 40. To facilitate passage of the retention members 16 through the holes 40, a chamfer 22 is provided on each of the retention members 16.

Also notable from FIG. 3 is the engagement of the biasing member 28 with the upper surface of the circuit board 36. The biasing member 28 has been elastically deformed from its arcuate configuration shown in FIG. 2, such that a resisting force is generated by the biasing member 28 which seeks to lift the head 12 of the fastener 10 off the upper surface of the circuit board 36. However, a moderate force imposed through the pushrod 30 is readily sufficient to maintain the biasing member 28 as shown in FIG. 3.

FIG. 4 illustrates the appearance of the fastener 10 once the pushrod 30 has been removed. Without the force imposed by the pushrod 30, the assembly thrust member 18 is permitted to again retract toward the head 12 of the fastener 10, as mandated by the elastic memory of the lower portion 13. In doing so, the retention members 16 are brought into engagement with the lower surface of the support chassis 38. The elastic memory of the flex joints 20 of the upper and lower members 14a and 14b, in conjunction with the biasing member 28, creates a clamping load which serves to clamp the circuit board 36 to the support chassis 38. Depending on the structural rigidity of the fastener 10 as determined by the geometry and size of the lower portion 13 and the material of the fastener 10, this clamping load may foreseeably be as much as about 30 pounds, but may vary greatly depending on the particular application. Given the intimate contact between the circuit board 36 and the support chassis 38, such a clamping load will reliably secure the circuit board 36 to the support chassis 38 when a sufficient number of fasteners 10 is employed.

Removal of the fastener 10 from the holes 40 is made possible through the access apertures 26 in the head 12 of the fastener 10. The upper members 14a can be reached through the access apertures 26 with a suitably thin tool in order to force the upper members 14a radially inward. As a result, the retention members 16 can be forced radially inward until the retention members 16 are able to pass through the holes 40, allowing removal of the fastener 10. Accordingly, plastic deformation of the fastener 10 is not required to remove the fastener 10 or disassemble the circuit board 36 from the support chassis 28.

Figure 5:
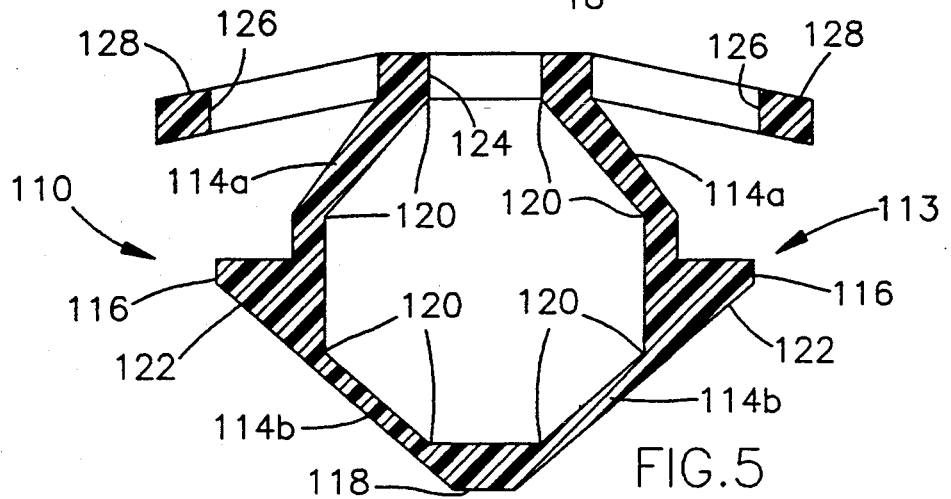
FIG. 5 is a cross-sectional side view of a fastener in accordance with a second embodiment of this invention.

A fastener 110 in accordance with a second embodiment of this invention is illustrated in FIG. 5. As with the fastener 10 of the first embodiment, the fastener 110 includes a head 112 to which a compliant lower portion 113 is attached. As shown, the head 12 has a generally planar shape, but with a pair of flanges 128 which are angled toward the lower portion 113. The flanges 128 serve the same function as the cantilevered biasing member 28 of the first embodiment, namely, to cooperate with the lower portion 113 to impose a clamping load on the circuit board and support chassis. The shape of the head 112 may be circular, but is preferably rectangular to minimize the surface area required to accommodate the fastener 110 on a circuit board. The head 112 has a guide aperture 124 which permits access to the interior of the lower portion 113. The head 112 also includes a pair of access apertures 126 which permit access to the exterior of the lower portion 113.

The lower portion 113 of this embodiment roughly has an octagonal shape, with a pair of retention members 116 projecting radially outward relative to the longitudinal axis of the fastener 110, and an assembly thrust member 118 projecting longitudinally away from the head 112. As before, the compliant lower portion 113 is preferably composed of two articulating segments, each of which consists of an upper member 114a, one of the retention members 116 and a lower member 114b. The above components are interconnected as described above for the first embodiment, with both lower members 114b being attached to the assembly thrust member 118. Articulation is enabled at the joints 120 defined in the regions where the contiguous members are interconnected. Generally, the joints 120 are shown as having a relatively thick cross-section so as to enhance the clamping load attainable by the fastener 110. As before, it is the compliant nature of the lower portion 113 which enables the fastener 110 to be installed through aligned holes in a circuit board and support chassis with only a moderate force.

Installation of the fastener 110 is essentially identical to that shown in FIGS. 2 and 3 for the fastener 10 of the first embodiment. The fastener 110 is first aligned with the holes 40, the pushrod 30 is inserted through the guide aperture 124 and abutted against the assembly thrust member 118, and then a moderate longitudinal force is applied to the head portion 34 of the pushrod 30 to install the fastener 110. Once installed, the retention members 116 engage the lower surface of the support chassis 38 and, in conjunction with the flanges 128, create a clamping load which serves to clamp the circuit board 36 to the support chassis 38. As before, removal of the fastener 110 is achieved through the access apertures 126 in the head 112 of the fastener 110.

From the above, it can be seen that either fastener of this invention significantly simplifies the assembly of a circuit board with a support chassis, whether achieved by an automated or manual operation. Essentially, the fastener is aligned with the holes, and then a moderate force is applied to the head of the pushrod until the retention members have cleared the lower surface of the support chassis. Release of the pushrod automatically engages the retention members with the lower surface of the support chassis, so as to generate a clamping force which secures the circuit board to the support chassis.

Because the assembly procedure enabled by the fasteners of this invention involves an uncomplicated linear motion, the disadvantages associated with assembly techniques which necessitate a rotational motion are avoided. Accordingly, the technique by which the fasteners of this invention is installed is highly suitable for both automated and manual assembly methods. The resilient nature of the lower portion of either fastener causes the retention members to resiliently re-expand once the installation force is removed from the pushrod, such that the desired clamping load is established by simply releasing the pushrod.

In addition, the fasteners can be designed to impose a predetermined clamping load between the circuit board and the support chassis, and can be readily removed by collapsing the lower portion via the access apertures. Because the fasteners are not destroyed during removal, but are resiliently collapsed, both fasteners can be easily reused.

Another significant advantage of this invention is that the fasteners can be formed from a sufficiently rigid but light weight thermoplastic, allowing the fasteners to be easily recycled. Furthermore, a preferred thermoplastic would be dielectric, such that the fasteners would not pose the potential for electrical shorting in the circuitry of a circuit board. Accordingly, the fasteners of this invention are a significant improvement over the metal threaded fasteners conventionally used to mount circuit boards in an enclosure or casing.

While our invention has been described in terms of a preferred embodiment, it is apparent that other forms could be adopted by one skilled in the art, for example, by substituting appropriate materials, or by utilizing the fasteners in an alternative environment, or by reconfiguring the geometry of the lower portion of the fasteners. Accordingly, the scope of our invention is to be limited only by the following claims.

The embodiments of the invention in which an exclusive property or privilege is claimed are defined as follows:

1. A fastener for securing two or more members together, said fastener comprising:

an upper portion;

a radially contractible lower portion flexibly interconnected with said upper portion, said lower portion being biased to assume a radially expanded configuration;

means interconnected with said lower portion for radially contracting said lower portion when said lower portion is longitudinally extended, said contracting means further including a plurality of upper interconnecting members pivotably attached to said upper portion and said engaging means, a plurality of lower interconnecting members pivotably attached to said engaging means, and an abutment member pivotably attached to said plurality of lower interconnecting members;

means interconnected with said lower portion for engaging at least one of said two or more members;

means associated with said upper portion for generating a clamping load between said upper portion and said engaging means; and means formed in said upper portion for providing access to said contracting means so as to enable said lower portion to be longitudinally extended;

whereby said fastener is receivable through a series of apertures in said two or more members while a force is applied to said contracting means so as to radially contract said lower portion, said lower portion radially re-expanding when said force is withdrawn from said contracting means, such that said engaging means engages said at least one of said two or more members, and such that said fastener is retained within said series of apertures and imposes said clamping load on said two or more members.

2. A fastener as recited in claim 1 wherein said lower portion and said contracting means are formed from a resilient material.

3. A fastener as recited in claim 1 further comprising means axially reciprocable relative to said lower portion for longitudinally extending said lower portion when said reciprocable means is reciprocated relative to said lower portion, so as to articulate said contracting means and radially contract said lower portion, and wherein said access means is a guide associated with said upper portion for guiding said reciprocable means.

4. A fastener as recited in claim 1 wherein said upper portion further comprises second means for access to said lower portion so as to enable radial contraction of said lower portion.

5. A fastener as recited in claim 1 wherein said generating means comprises a cantilevered biasing member.

6. A compliant fastener for securing two or more members together, the compliant fastener comprising:

an upper portion having guide means formed therein;

a plurality of upper members pivotably interconnected to said upper portion;

a plurality of radially contractible retention members pivotably interconnected to said plurality of upper members, said plurality of retention members being biased to assume a radially expanded configuration;

a plurality of lower members pivotably interconnected to said plurality of retention members;

means for interconnecting said plurality of lower members;

means attached to said upper portion for generating a clamping load between said upper portion and said plurality of retention members; and means axially reciprocable with said guide means for longitudinally extending said interconnecting means relative to said upper portion so as to radially contract said plurality of retention members;

whereby said compliant fastener is receivable through a series of apertures through said two or more members while a force is applied to said reciprocable means so as to longitudinally extend said interconnecting means and radially contract said plurality of retention members, said plurality of retention members radially re-expanding when said force is released such that said plurality of retention members engages at least one of said two or more members, and such that said compliant fastener is retained within said series of apertures and imposes said clamping load on said two or more members.

7. A compliant fastener as recited in claim 6 wherein said plurality of upper members, said plurality of lower members and said interconnecting means are formed from a thermoplastic material.

8. A compliant fastener as recited in claim 6 wherein said reciprocable means is a pushrod.

9. A compliant fastener as recited in claim 6 wherein said upper portion further comprises means for access to at least one of said plurality of upper members so as to enable radial contraction of said plurality of retention means.

10. A compliant fastener as recited in claim 6 wherein said generating means comprises a cantilevered biasing member extending substantially radially from said upper portion.

11. A compliant fastener as recited in claim 6 wherein said interconnecting means comprises an abutment member pivotably interconnected to said plurality of lower members.

12. A compliant fastener as recited in claim 6 wherein said guide means comprises an aperture formed through said upper portion.

13. A compliant fastener as recited in claim 6 wherein each of said plurality of retention members has a chamfered portion for promoting insertion of said compliant fastener into said series of apertures.

14. A compliant fastener for securing a circuit board to a support chassis, the compliant fastener comprising:

a head portion having an aperture formed therethrough;

a plurality of resilient upper members pivotably attached to said head portion;

a plurality of radially contractible retention members pivotably attached to said plurality of resilient upper members, said plurality of retention members being biased to assume a radially expanded configuration, each of said plurality of retention members having a chamfered portion;

a plurality of resilient lower members pivotably attached to said plurality of retention members;

abutment means pivotably attached to said plurality of resilient lower members;

a resilient cantilevered member attached to said head portion for generating a clamping load between said head portion and said plurality of retention members; and means axially reciprocable through said aperture and engagable with said abutment means for longitudinally extending said abutment means relative to said head portion so as to radially contract said plurality of retention members relative a longitudinal axis of said fastener;

whereby said compliant fastener is receivable through an aligned pair of apertures in said circuit board and said support chassis while a force is applied to said reciprocable means so as to longitudinally extend said abutment means and radially contract said plurality of retention members, said chamfered portions promoting insertion of said compliant fastener into said pair of apertures, said plurality of retention members radially expanding when said force is released such that said plurality of retention members engages said support chassis, so as to retain said compliant fastener within said pair of apertures and impose said clamping load on said circuit board and said support chassis.

15. A compliant fastener as recited in claim 14 wherein said compliant fastener is formed from a polymeric material.

16. A compliant fastener as recited in claim 14 wherein said reciprocable means is a pushrod.

17. A compliant fastener as recited in claim 14 wherein said head portion further comprises means for access to at least one of said plurality of resilient upper members so as to enable radial contraction of said plurality of retention means.

18. A compliant fastener as recited in claim 14 wherein said resilient cantilevered member extends substantially radially from said upper portion.

19. A fastener for securing two or more members together, said fastener comprising:
an upper portion;
a radially contractible lower portion flexibly interconnected with said upper portion, said lower portion being biased to assume a radially expanded configuration, said lower portion having interior and exterior surfaces;
means interconnected with said lower portion for radially contracting said lower portion when said lower portion is longitudinally extended;
means interconnected with said lower portion for engaging at least one of said two or more members;
means associated with said upper portion for generating a clamping load between said upper portion and said engaging means;
means formed in said upper portion for providing access to said interior surface of said lower portion and said contracting means so as to enable said lower portion to be longitudinally extended by application of a longitudinal force to said contracting means; and
means formed in said upper portion for providing access to said exterior surface of said lower portion so as to enable radial contraction of said lower portion by application of a radial force to said lower portion;

whereby said fastener is receivable through a series of apertures in said two or more members while the longitudinal force is applied to said contracting means so as to radially contract said lower portion, said lower portion radially re-expanding when said longitudinal force is withdrawn from said contracting means, such that said engaging means engages said at least one of said two or more members, and such that said fastener is retained within said series of apertures and imposes said clamping load on said two or more members, and said fastener being removable from said series of apertures in said two or more members when the radial force is applied to the exterior of the lower portion to radially contract said lower portion and disengage said engaging means from said at least one of said two or more members.

* * * * *